US007236366B2

(12) United States Patent
Chen

(10) Patent No.: US 7,236,366 B2

(45) Date of Patent: Jun. 26, 2007

(54) HIGH BRIGHTNESS LED APPARATUS WITH AN INTEGRATED HEAT SINK

(75) Inventor: An-Si Chen, Taichung (TW)

(73) Assignee: Excel Cell Electronic Co., Ltd., Taichung (TW)

( * ) Notice: Subject to any disclaimer, the term of this patent is extended or adjusted under 35 U.S.C. 154(b) by 329 days.

(21) Appl. No.: 10/896,986

(22) Filed: Jul. 23, 2004

(65) Prior Publication Data

US 2006/0018099 A1 Jan. 26, 2006

(51) Int. Cl.
*H05K 7/20* (2006.01)
*F21V 7/00* (2006.01)

(52) U.S. Cl. ...................... 361/709; 361/707; 361/719; 362/218; 362/294; 362/373; 257/712

(58) Field of Classification Search ................ 361/704, 361/705, 707, 709, 712, 717–719; 257/678, 257/291–293, 99, 103, 75, 88, 712, 725, 257/431–434; 362/218, 227, 294, 373, 555, 362/800, 487, 543, 545, 382, 396.11; 174/16.3, 174/252; 165/80.2, 80.3, 185
See application file for complete search history.

(56) References Cited

U.S. PATENT DOCUMENTS 5,390,093 A 2/1995 Himeno et al.
5,632,557 A 5/1997 Simons
5,857,767 A 1/1999 Hochstein
6,060,729 A 5/2000 Suzuki
6,254,262 B1 7/2001 Crunk et al.
6,428,189 B1 8/2002 Hochstein
6,480,389 B1 * 11/2002 Shie et al. .................. 361/707
6,517,218 B2 * 2/2003 Hochstein .................. 362/294
6,517,248 B1 2/2003 Martin
6,541,800 B2 4/2003 Barnett
6,561,680 B1 * 5/2003 Shih ........................... 362/294
6,603,148 B1 8/2003 Sano
6,833,566 B2 * 12/2004 Suehiro et al. ............... 257/99
6,999,318 B2 * 2/2006 Newby ....................... 361/719
2003/0058650 A1 3/2003 Shih
2003/0063474 A1 4/2003 Coushaine
2003/0189830 A1 10/2003 Sugimoto
2004/0052077 A1 3/2004 Shih (Continued)

FOREIGN PATENT DOCUMENTS

DE 10251955 A1 5/2005

(Continued)

*Primary Examiner*—Michael Datskovskiy
(74) *Attorney, Agent, or Firm*—Fitzpatrick, Cella, Harper & Scinto

(57) ABSTRACT

A high brightness LED apparatus with an integrated heat sink includes a heat sink base and at least one LED mounted in the heat sink base. The heat sink base includes multiple dissipating fins formed integrally on the substrate. Each of the at least one LED includes a body and multiple dies. The body is mounted in the substrate and includes a conductive seat with a top recess. The dies are mounted on the conductive seat in the top recess and produce a great amount of light beams for an enhanced brightness of illumination. The dissipating fins will efficiently dissipate heat produced by the at least one LED to prevent each LED from brightness decay and extend the useful life of each LED.

11 Claims, 6 Drawing Sheets

U.S. PATENT DOCUMENTS

| | | | |
|---|---|---|---|
| 2004/0057252 | A1 | 3/2004 | Coushaine |
| 2004/0264195 | A1 | 12/2004 | Chang |
| 2005/0068776 | A1* | 3/2005 | Ge ............................ 362/296 |
| 2005/0122018 | A1 | 6/2005 | Morris |
| 2005/0157500 | A1 | 7/2005 | Chen |

FOREIGN PATENT DOCUMENTS

| | | | |
|---|---|---|---|
| EP | 0559124 | A1 | 9/1993 |
| EP | 1467414 | A1 | 10/2004 |
| WO | 2004079256 | A1 | 9/2004 |

* cited by examiner

HIGH BRIGHTNESS LED APPARATUS WITH AN INTEGRATED HEAT SINK

BACKGROUND OF THE INVENTION

1. Field of the Invention

The present invention relates to a light emitting diode (LED) apparatus, and more particularly to a high brightness LED apparatus with an integrated heat sink so that the LED apparatus will produce high performance brightness and dissipate efficiently heat accumulated in the LED apparatus while the LED apparatus produces light.

2. Description of Related Arts

Light emitting diodes (LEDs) have been extensively used for illumination and visible indicator purposes. A light emitting diode comprises generally a single die and two conductive leads. The leads connect to the die to establish a path of transmitting electricity so that the die will produce light beams as the electricity drives the die.

Using a single die in one single LED cannot produce sufficient light for illumination. An LED apparatus as being an illuminative apparatus generally comprises a great quantity of LEDs to create bright illuminations. However, the LED will simultaneously produce both light and heat. The large number of the LEDs that are arranged in an identical surface will rapidly accumulate heat around the entire illuminative apparatus. Unless the accumulated heat from the illuminative apparatus is removed quickly and efficiently, the illuminative apparatus may cause a hazard or damage.

The heat produced by the LEDs should be quickly removed from the LED apparatus to keep the temperature of the entire LED apparatus from rapidly becoming high. If the heat produced by the LEDs cannot be efficiently dissipated, the accumulated heat may cause unexpected damage to or influence normal operations of other parts adjacent to the LED apparatus.

To overcome the shortcomings, the present invention provides an LED apparatus that produces high brightness and has an integrated heat sink to mitigate or obviate the aforementioned problems.

SUMMARY OF THE INVENTION

The main objective of the invention is to provide an LED apparatus with an integrated heat sink and at least one LED for illumination, each of the at least one LED has multiple dies inside to enhance illuminative brightness and the heat sink will keep the LEDs from brightness decay and extend the useful life of the LEDs.

An LED apparatus with an integrated heat sink includes a heat sink base and at least one LED mounted in the heat sink base. The heat sink base includes a substrate and multiple dissipating fins formed integrally on the substrate. Each of the at least one LED includes a body and multiple dies. The body is mounted in the substrate and includes a conductive seat with a top recess. The dies are mounted on the conductive seat in the top recess and produce a great amount of light beams for enhanced brightness of illumination. The dissipating fins efficiently dissipate heat produced by the at least one LED to prevent each LED from brightness decay and extend the useful life of each LED.

Other objectives, advantages and novel features of the invention will become more apparent from the following detailed description when taken in conjunction with the accompanying drawings.

DETAILED DESCRIPTION OF PREFERRED EMBODIMENT

Figure 1:
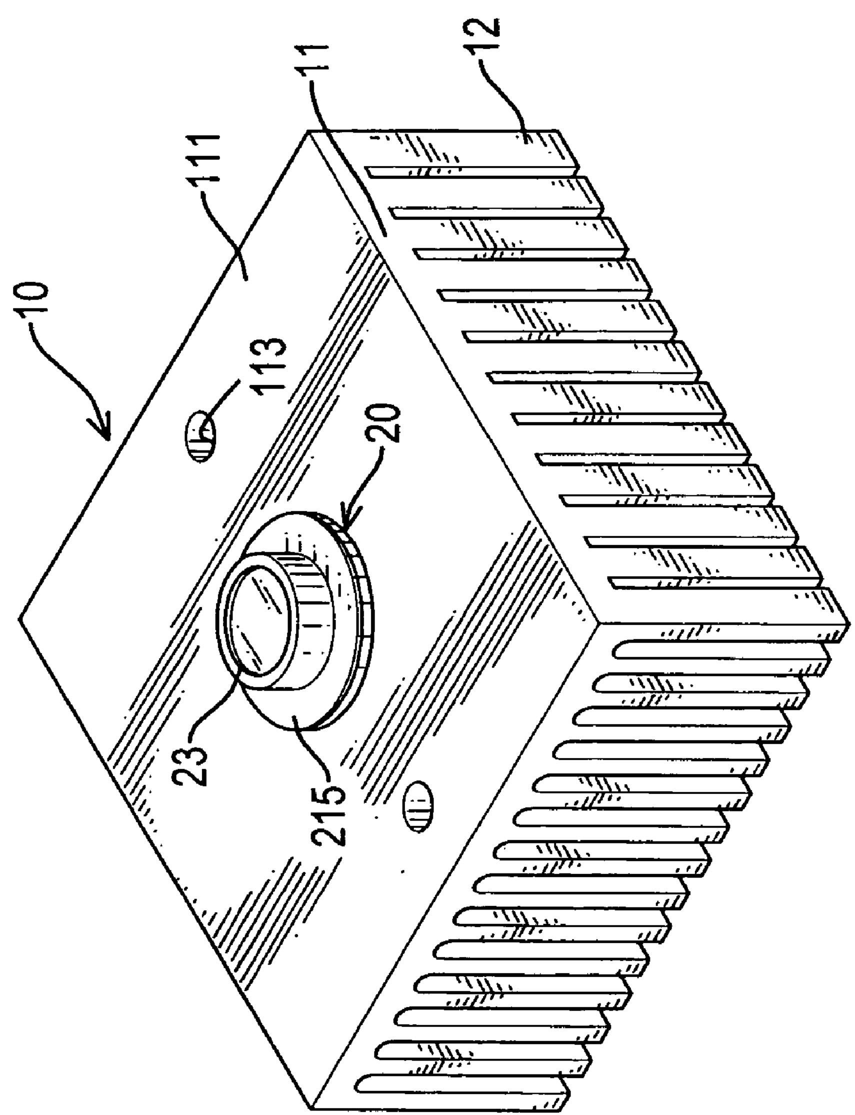
FIG. 1 is a perspective view of a high brightness LED apparatus with an integrated heat sink in accordance with the present invention.
Figure 4:
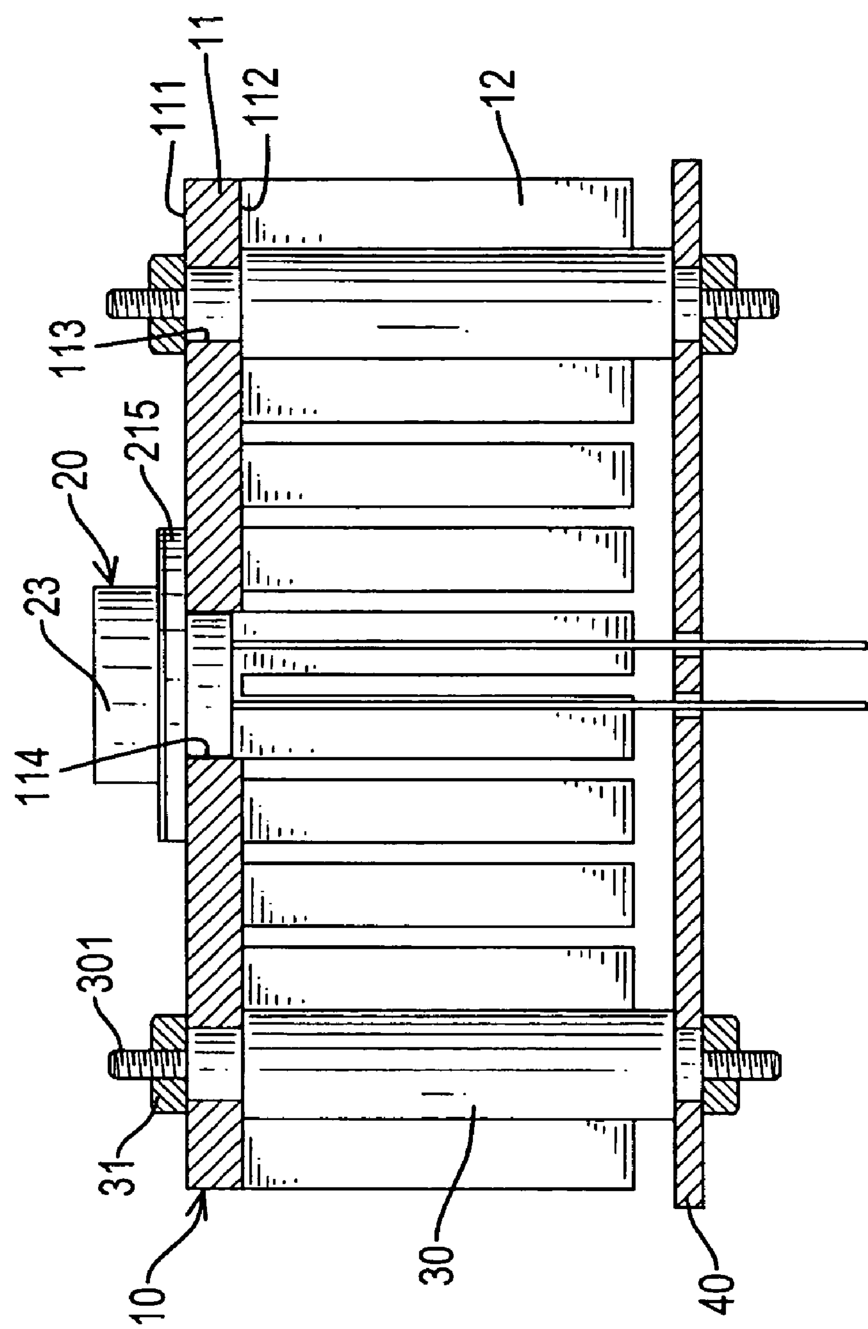
FIG. 4 is an operational side elevational view in partial section of the LED apparatus with an integrated heat sink in FIG. 1 when the LED apparatus is mounted on a circuit board.

With reference to FIGS. 1 and 4, a first embodiment of a high brightness LED apparatus with an integrated heat sink in accordance with the present invention comprises a heat sink base (10) and an LED (20).

The heat sink base (10) is made of the high thermal conductivity materials and comprises a substrate (11) and multiple integrated dissipating fins (12). The substrate (11) is a planar block and has a first surface (111), a second surface (112), multiple mounting holes (113) and an LED hole (114). The first surface (111) is opposite to the second surface (112). The holes (113, 114) are defined completely through the substrate (11). The dissipating fins (12) are formed and arranged on the entire second surface (112) of the substrate (11).

Figure 2:
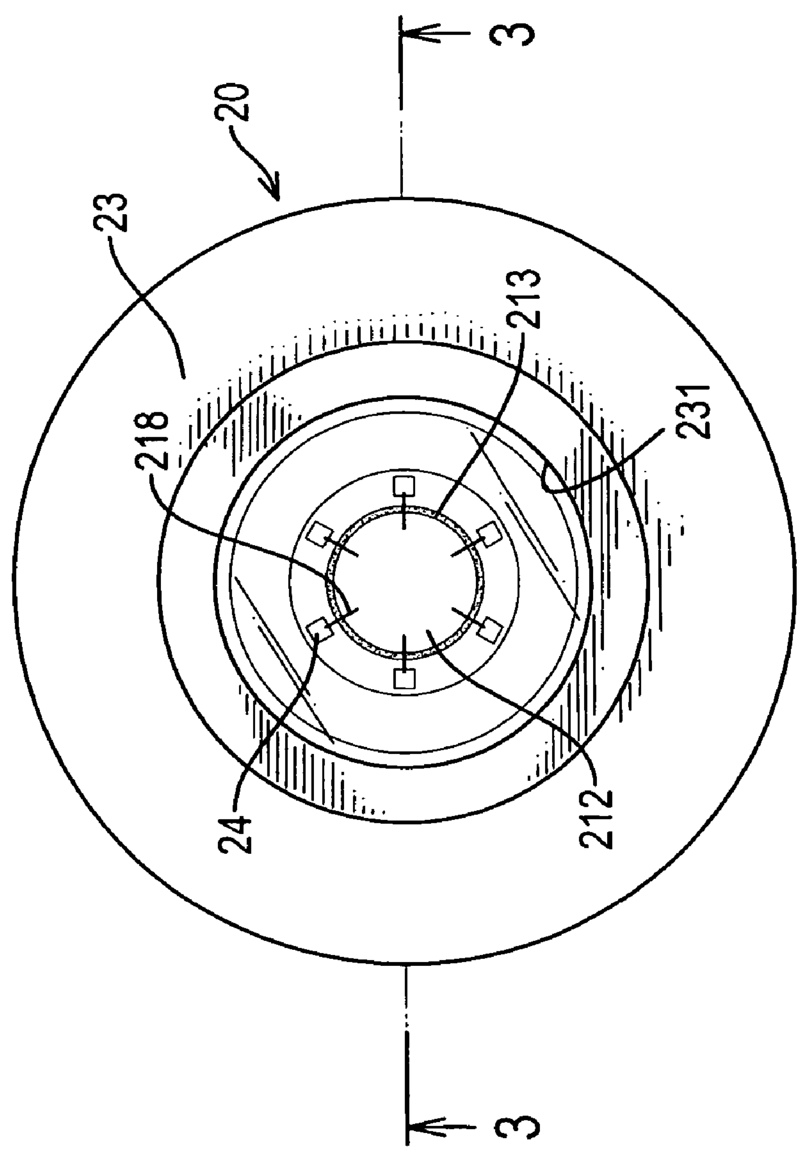
FIG. 2 is a top plan view of an LED of the LED apparatus in FIG. 1.
Figure 3:
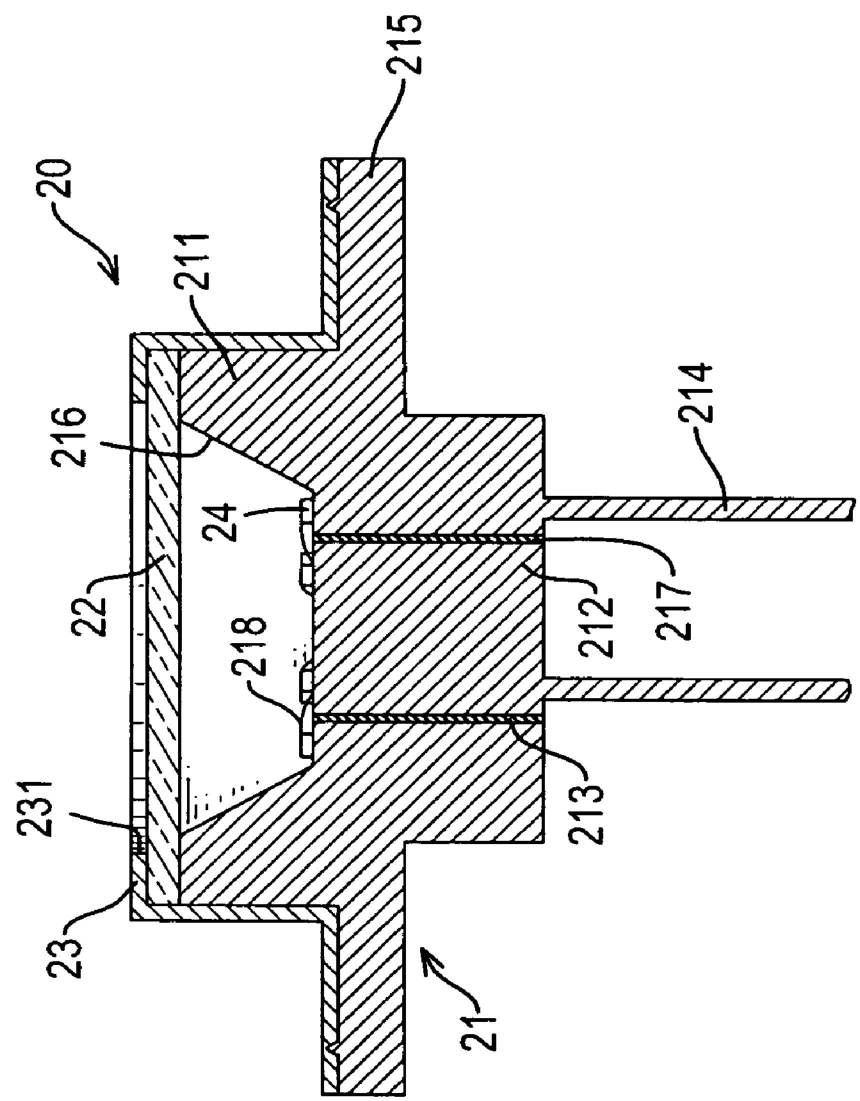
FIG. 3 is a cross sectional side elevational view of the LED along line 3—3 in FIG. 2.

With reference to FIGS. 2, 3 and 4, the LED (20) is mounted and held in the LED hole (114) in the substrate (11) and comprises a body (21), a cover (22), an outside casing (23) and multiple dies (24).

The body (21) is held in the LED hole (114) and comprises a conductive seat (211), an embedded conductor (212), an insulating layer (213) and two conductive leads (214). The conductive seat (211) has an annular lip (215), a top recess (216) and a through hole (217). The annular lip (215) abuts on the first surface (111) of the substrate (11).

The embedded conductor (212) is mounted and held in the through hole (217) of the conductive seat (211) with the insulating layer (213), whereby the insulating layer (213) insulates electrically the embedded conductor (212) from the conductive seat (211). The conductive leads (214) are respectively coupled to the conductive seat (211) and the embedded conductor (212). Therefore, the conductive seat (211) and the embedded conductor (212) can be used to transmit different poles of the electricity to the dies (24) via the conductive leads (214).

The dies (24) are mounted on and connected to the conductive seat (211) in the top recess (216) and are electrically connected to the embedded conductor (212) through wires (218).

The cover (22) is attached to the conductive seat (211) to cover the top recess (216) and is clamped by the outside casing (23). The outside casing (23) is mounted on the conductive seat (211) to clamp the cover (22) and has a presenting hole (231). The presenting hole (231) is defined completely through the outside casing (23) and is aligned with the top recess (216) through which the light beams produced by the dies (24) will be emitted.

With reference to FIG. 4, the LED apparatus is mounted on a circuit board (40) with two threaded rods (30) and multiple nuts (31). Each of the threaded rods (30) has two threaded studs (301) formed at respective ends. The threaded studs (301) extend respectively through the circuit board (40) and the mounting holes (113) of the substrate (11) onto which the nuts (31) screw respectively to fasten the LED apparatus on the circuit board (40).

Figure 5:
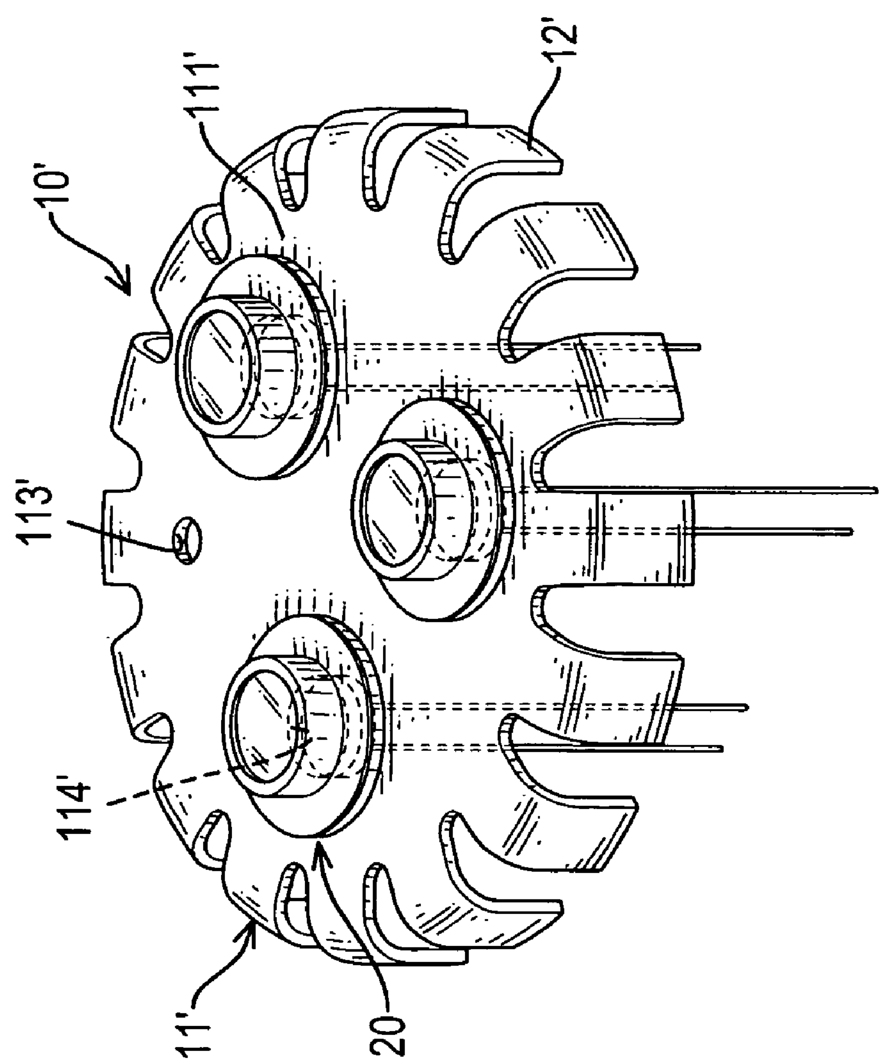
FIG. 5 is a perspective view of a second embodiment of the LED apparatus in accordance with the present invention.

With reference to FIG. 5, a second embodiment of the LED apparatus comprises a heat sink base (10') and multiple LEDs (20). The heat sink base (10') has a thin disk substrate (11') and multiple dissipating fins (12'). The substrate (11') has a first surface (111'), a second surface, an annular edge, a mounting hole (113'), and multiple LED holes (114'). The first surface (111') is opposite to the second surface. The holes (113', 114') are defined completely through the substrate (11'). The LEDs (20) are respectively mounted in the LED holes (114').

The dissipating fins (12') are integrally formed on the second surface along the annular edge of the substrate (11') by bending or forging to dissipate the heat.

Figure 6:
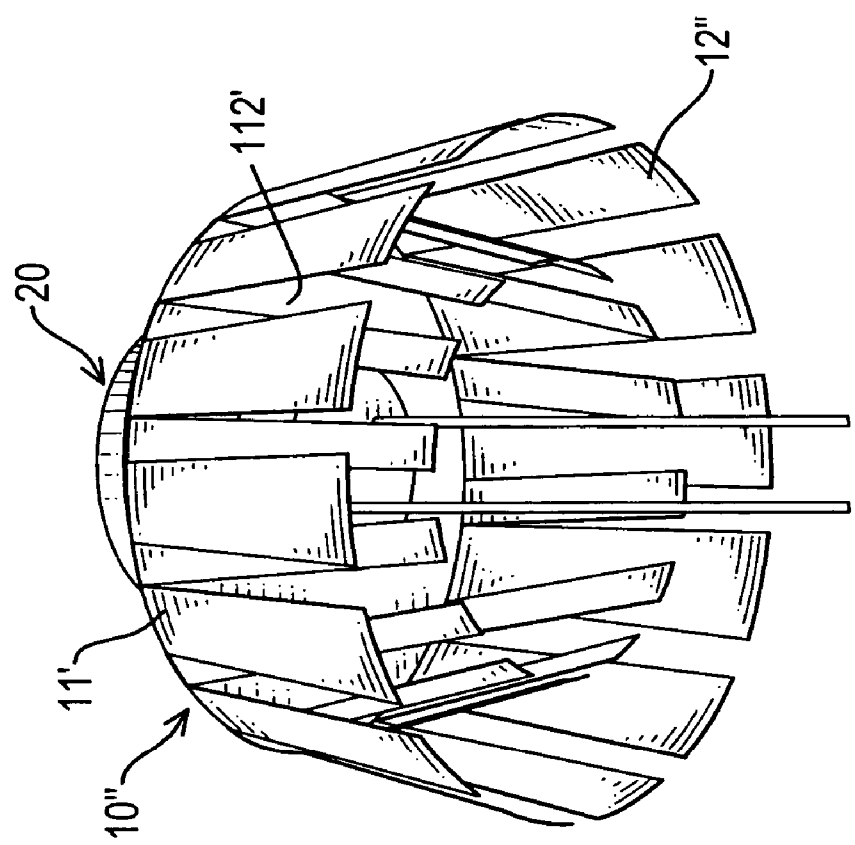
FIG. 6 is a perspective view of a third embodiment of the LED apparatus in accordance with the present invention.

With reference to FIG. 6, a third embodiment of the LED apparatus comprises a heat sink base (10") and multiple LEDs (20). The heat sink base (10") has a thin disk substrate (11") and multiple dissipating fins (12"). The substrate (11") has a first surface, a second surface (112"), an annular edge and multiple LED holes. The first surface is opposite to the second surface (112").

The dissipating fins (12") are integrally formed on the second surface (112") along the annular edge of the substrate (11') by bending or forging and are arranged complementarily relative to each other to dissipate the heat.

Consequently, each of the LEDs (20) that has multiple dies (24) will produce high brightness for illumination. The dissipating fins (12, 12', 12") of the heat sink bases (10, 10', 10") will improve the performance of dissipating the heat produced by the LEDs (20). The heat will not easily accumulate around the entire LED apparatus. The LEDs (20) of the LED apparatus can produce light to brighten a display or illuminate a dark place. The LED apparatus with an integrated heat sink will prevent the LEDs (20) from brightness decay and extend the useful life of the LEDs (20).

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the scope of the appended claims.

What is claimed is:

1. A high brightness LED apparatus with an integrated heat sink, and the high brightness LED apparatus comprising a heat sink base comprising
a substrate; and
multiple dissipating fins formed integrally on the substrate; and
at least one LED mounted in the substrate and each of the at least one LED comprising
a body mounted in the substrate and comprising
a conductive seat having a top recess;
an embedded conductor mounted in the conductive seat;
an insulating layer mounted in the conductive seat and surrounding the embedded conductor to insulate electrically the embedded conductor from the conductive seat; and
two conductive leads coupled respectively to the conductive seat and the embedded conductor; and
multiple dies mounted on and connected to the conductive seat in the top recess and connected electrically to the embedded conductor.

2. The high brightness LED apparatus with an integrated heat sink as claimed in claim 1, wherein the substrate is a planar block that has a first surface and a second surface opposite the first surface; and
the dissipating fins are formed and arranged on the entire second surface of the substrate.

3. The high brightness LED apparatus with an integrated heat sink as claimed in claim 2, wherein the substrate further has at least one LED hole; and
each one of the at least one LED is held in a respective one of the at least one LED hole and further comprises
a cover attached to the conductive seat to cover the top recess; and
an outside casing mounted on the conductive seat to clamp the cover and having a presenting hole aligned with the top recess.

4. The high brightness LED apparatus with an integrated heat sink as claimed in claim 2, wherein the body of each one of the at least one LED further has an annular lip abutting on the first surface of the substrate.

5. The high brightness LED apparatus with an integrated heat sink as claimed in claim 1, wherein the substrate is a thin disk and has a first surface, a second surface opposite the first surface and an annular edge; and
the dissipating fins are formed on the second surface along the annular edge of the substrate.

6. The high brightness LED apparatus with an integrated heat sink as claimed in claim 5, wherein the substrate further has at least one LED hole; and
each one of the at least one LED is held in a respective one of the at least one LED hole and further comprises
a cover attached to the conductive seat to cover the top recess; and
an outside casing mounted on the conductive seat to clamp the cover and having a presenting hole aligned with the top recess.

7. The high brightness LED apparatus with an integrated heat sink as claimed in claim 6, wherein the body of each one of the at least one LED further has an annular lip abutting on the first surface of the substrate.

8. The high brightness LED apparatus with an integrated heat sink as claimed in claim 1, wherein the substrate is a thin disk and has a first surface, a second surface opposite the first surface and an annular edge; and
the dissipating fins are formed on the second surface and are complementarily arranged along the annular edge of the substrate.

9. The high brightness LED apparatus with an integrated heat sink as claimed in claim 8, wherein the substrate further has at least one LED hole; and
each one of the at least one LED is held in a respective one of the at least one LED hole and further comprises
a cover attached to the conductive seat to cover the top recess; and an outside casing mounted on the conductive seat to clamp the cover and having a presenting hole aligned with the top recess.

10. The high brightness LED apparatus with an integrated heat sink as claimed in claim 9, wherein the body of each one of the at least one LED further has an annular lip abutting on the first surface of the substrate.

11. The high brightness LED apparatus with an integrated heat sink as claimed in claim 1, wherein the substrate has at least one mounting hole.

* * * * *